(12) United States Patent
Jaipaul

(10) Patent No.: US 11,616,404 B2
(45) Date of Patent: Mar. 28, 2023

(54) WIRELESS VEHICLE LIFT CHARGING USING LIGHT

(71) Applicant: Gray Manufacturing Company, Inc., St. Joseph, MO (US)

(72) Inventor: Larry M. Jaipaul, Clarence, NY (US)

(73) Assignee: Gray Manufacturing Company, Inc., St. Joseph, MO (US)

( * ) Notice: Subject to any disclaimer, the term of this patent is extended or adjusted under 35 U.S.C. 154(b) by 711 days.

(21) Appl. No.: 16/675,908

(22) Filed: Nov. 6, 2019

(65) Prior Publication Data

US 2020/0140247 A1    May 7, 2020

Related U.S. Application Data

(60) Provisional application No. 62/756,366, filed on Nov. 6, 2018.

(51) Int. Cl.
| | |
|---|---|
| *H02J 50/30* | (2016.01) |
| *H02J 50/60* | (2016.01) |
| *B01J 19/12* | (2006.01) |
| *H01L 31/042* | (2014.01) |
| *B66F 3/46* | (2006.01) |
| *H02J 50/00* | (2016.01) |
| *H02J 7/00* | (2006.01) |
| *H02J 50/90* | (2016.01) |
| *H02J 7/04* | (2006.01) |
| *H02J 50/40* | (2016.01) |

(52) U.S. Cl.
CPC ............. *H02J 50/60* (2016.02); *B01J 19/123* (2013.01); *B66F 3/46* (2013.01); *H01L 31/042* (2013.01); *H02J 7/00712* (2020.01); *H02J 7/04* (2013.01); *H02J 50/005* (2020.01); *H02J 50/30* (2016.02); *H02J 50/40* (2016.02); *H02J 50/90* (2016.02); *Y02E 10/50* (2013.01)

(58) Field of Classification Search
CPC .......... H02J 50/60; H02J 7/00712; H02J 7/04; H02J 50/005; H02J 50/30; H02J 50/40; H02J 50/90; B01J 19/123; B66F 3/46; H01L 31/042; Y02E 10/50
See application file for complete search history.

(56) References Cited

U.S. PATENT DOCUMENTS

| | | | |
|---|---|---|---|
| 5,685,505 A * | 11/1997 | Meckler ................. | B64G 1/428 244/172.7 |
| 9,711,998 B2 * | 7/2017 | Nakano ............ | H04B 10/07955 |
| 9,884,751 B2 * | 2/2018 | Jaipaul .................... | H02J 50/90 |

(Continued)

*Primary Examiner* — Stacy Whitmore
(74) *Attorney, Agent, or Firm* — Hovey Williams LLP; Kameron D. Kelly

(57) ABSTRACT

A vehicle lift system configured for wireless charging is disclosed. The vehicle lift system includes a vehicle lift and a light transmitter. The vehicle lift includes a base, a carriage, a lift actuator, a battery, and a photovoltaic receiver. The carriage is configured for receiving a wheel of a vehicle. The lift actuator is configured to vertically raise and lower the carriage relative to the base. The battery is configured to provide electrical energy to the vehicle lift. The photovoltaic receiver is electrically coupled with the battery. The light transmitter is configured for transmitting electrical energy to said photovoltaic receiver. Thus, the battery of the vehicle lift can be recharged wirelessly, such that the vehicle lift need not have a wired power connection.

19 Claims, 8 Drawing Sheets

(56) References Cited

U.S. PATENT DOCUMENTS

| | | | |
|---|---|---|---|
| 11,027,952 B2* | 6/2021 | Luinge | B66F 7/16 |
| 11,391,599 B1* | 7/2022 | Anvari | G08G 5/0047 |
| 2008/0211458 A1* | 9/2008 | Lawther | H02J 50/90 |
| | | | 320/132 |
| 2012/0266803 A1* | 10/2012 | Zediker | E21B 41/04 |
| | | | 250/215 |
| 2016/0185580 A1* | 6/2016 | Luinge | G06F 3/0482 |
| | | | 414/800 |
| 2017/0081158 A1* | 3/2017 | Jaipaul | H01Q 1/248 |
| 2017/0217361 A1* | 8/2017 | Miller | B66F 17/003 |
| 2018/0237278 A1* | 8/2018 | Jaipaul | B66F 3/46 |
| 2019/0064353 A1* | 2/2019 | Nugent, Jr. | H02J 50/60 |
| 2019/0305164 A1* | 10/2019 | Vawter | H01L 31/0468 |
| 2020/0194745 A1* | 6/2020 | Li | G05D 1/0011 |
| 2021/0185424 A1* | 6/2021 | Kowalk | H04R 1/1025 |
| 2022/0148341 A1* | 5/2022 | Martin | G01R 31/367 |
| 2022/0190612 A1* | 6/2022 | Fuchs | H02J 7/0047 |
| 2022/0219260 A1* | 7/2022 | Feldmann | G02F 1/2955 |
| 2022/0224166 A1* | 7/2022 | Sato | H02J 50/80 |

\* cited by examiner

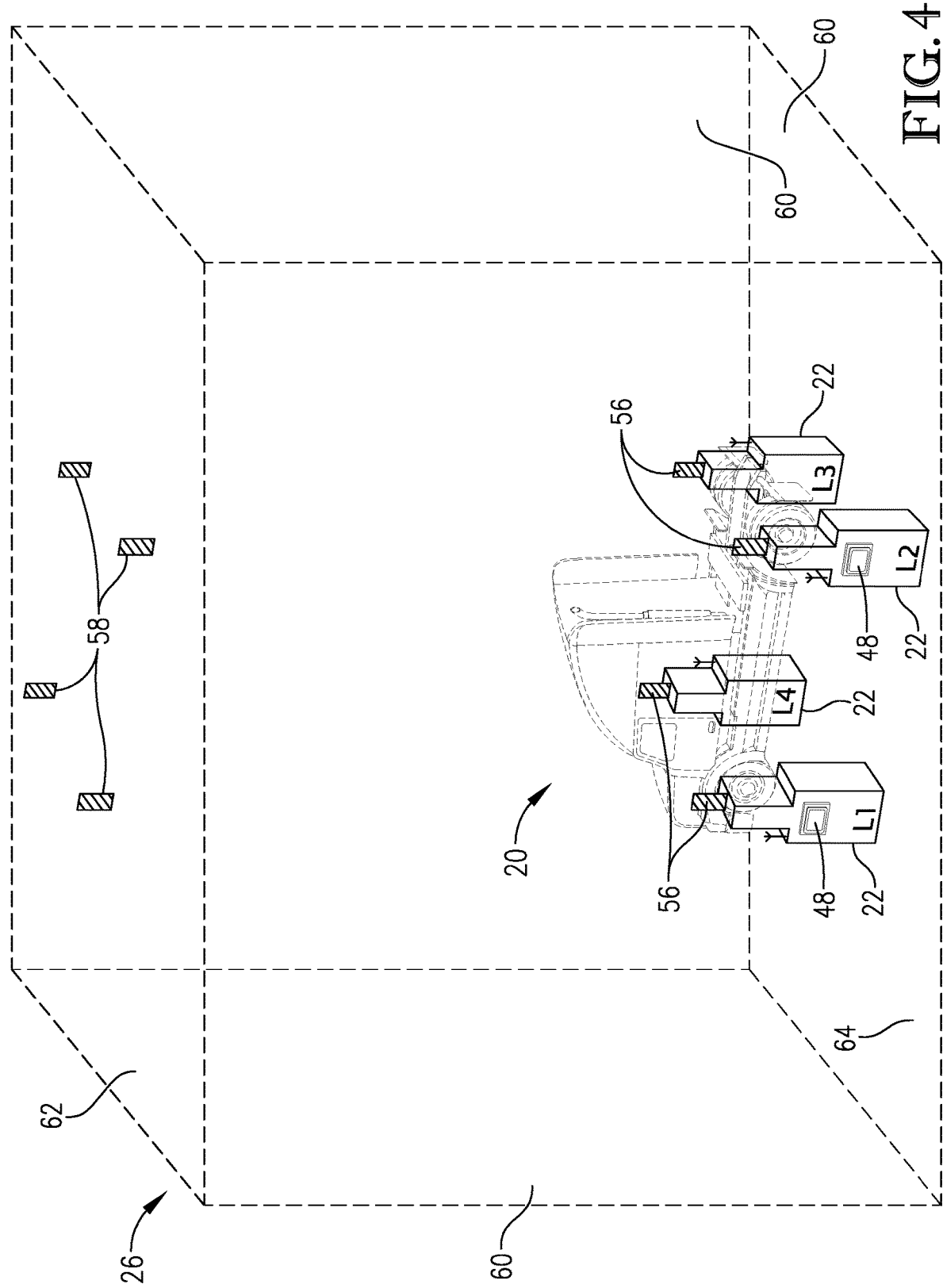

WIRELESS VEHICLE LIFT CHARGING USING LIGHT

RELATED APPLICATIONS

This non-provisional patent application claims priority benefit, with regard to all common subject matter, of commonly assigned U.S. provisional patent application Ser. No. 62/756,366, filed Nov. 6, 2018, and entitled "WIRELESS VEHICLE LIFT CHARGING USING LIGHT" ("the '366 application"). The '366 application is hereby incorporated by reference in its entirety into the present application.

Embodiments and/or features of the invention described in the present document may be used with the subject matter disclosed in commonly assigned U.S. Pat. No. 9,352,944, filed Mar. 15, 2013, issued May 13, 2016, and entitled "CONTROL AND COMMUNICATION SYSTEM FOR A WIRELESS VEHICLE LIFT SYSTEM" ("the '944 patent"). The '944 patent is hereby incorporated by reference in its entirety into the present application.

BACKGROUND

1. Field of the Invention

The present disclosure relates generally to vehicle lift systems. More particularly, the present disclosure concerns a vehicle lift system configured for wireless charging via light.

2. Description of the Prior Art

The need to lift a vehicle from the ground for service work is well established. For instance, it is often necessary to lift a vehicle for tire rotation or replacement, steering alignment, oil changes, brake inspections, exhaust work, and other automotive maintenance. Traditionally, lifting a vehicle has been accomplished through the use of equipment that is built-into a service facility, such as either lift units with hydraulic actuator(s) installed below the surface of the floor or two and four-post type lift systems installed on the floor surface. These built-in units are located at a fixed location at the service facility and adapted to engage a vehicle frame to lift the vehicle from the ground.

In an effort to increase the versatility and mobility of lift devices and to reduce the need to invest in permanently mounted lifting equipment, devices commonly known as a mobile column lifts (MCLs) have been developed. These MCLs are often used in open areas with other tools and equipment. As such, permanent power cables for these MCLs can be problematic as they limit mobility. Accordingly, there exists a need for a vehicle lift configured for wireless charging, such that the lift can be continuously charged while the lift is out of range of a power cord or when it is otherwise impractical to use a power cord. Although certain types of wireless power transfer devices have been used in the past for charging small-sized batteries (e.g., as may be used in small, handheld computing devices), such previously-used wireless power transfer devices have generally been restricted to transferring electrical power over small distances and in small magnitudes.

As such, there is a need for a vehicle lift system configured to provide wireless charging to the vehicle lifts such that the batteries of the lifts can remain sufficiently charged even when the lifts are out of range of a physical power cord or when it is otherwise impractical to use a physical power cord. Furthermore, there is a need for a wireless charging system for vehicle lifts that provides efficient wireless charging over long distances and having sufficient power magnitudes that charging can be performed quickly and efficiently.

SUMMARY

Embodiments of the invention solve the above-mentioned problem by providing wireless charging for a vehicle lift system. The wireless charging allows the vehicle lifts to be placed throughout a workspace without the need for wired connections. The wireless charging vehicle lift system converts electrical energy into light energy, transmits the light energy to the vehicle lifts, and then converts the light energy back into electrical energy for use by the vehicle lifts.

A first embodiment of the invention is directed to a vehicle lift system configured for wireless charging. The vehicle lift system includes a vehicle lift and a light transmitter. The vehicle lift includes a base, a carriage, a lift actuator, a battery, and a photovoltaic receiver. The carriage is configured for receiving a wheel of a vehicle. The lift actuator is configured to vertically raise and lower the carriage relative to the base. The battery is configured to provide electrical energy to the vehicle lift. The photovoltaic receiver is electrically coupled with the battery. The light transmitter is configured for transmitting electrical energy to said photovoltaic receiver.

A second embodiment of the invention is directed to a wireless charging vehicle lift system configured to be utilized with a first mobile vehicle lift having a first battery and a second mobile vehicle lift having a second battery. The wireless charging vehicle lift system comprises a light transmitter, a first photovoltaic receiver, a second photovoltaic receiver, and a control system. The light transmitter is configured for transmitting light. The first photovoltaic receiver is configured for receiving at least a portion of the light transmitted by the at least one light transmitter. The first photovoltaic receiver is electrically coupled with first battery of the first mobile vehicle lift. The second photovoltaic receiver is configured for receiving at least a portion of the light transmitted by the at least one light transmitter. The second photovoltaic receiver is electrically coupled with the second battery of the second mobile lift. The control system is configured for controlling at least one of the light transmitter, the first photovoltaic receiver, and the second photovoltaic receiver.

A third embodiment of the invention is directed to a method for wirelessly providing power to a portable vehicle lift. The method includes the following steps: positioning a mobile vehicle lift within a charging area; transmitting light energy from a light transmitter to a photovoltaic receiver positioned on the vehicle lift; converting, via the photovoltaic receiver, the light energy from the light transmitter to electrical energy; and charging a battery associated with the vehicle lift with the electrical energy.

Advantages of these and other embodiments will become more apparent to those skilled in the art from the following description of the exemplary embodiments which have been shown and described by way of illustration. As will be realized, the present embodiments described herein may be capable of other and different embodiments, and their details are capable of modification in various respects. Accordingly, the drawings and description are to be regarded as illustrative in nature and not as restrictive.

BRIEF DESCRIPTION OF THE DRAWINGS

The Figures described below depict various aspects of systems and methods disclosed therein. It should be understood that each Figure depicts an embodiment of a particular aspect of the disclosed systems and methods, and that each of the Figures is intended to accord with a possible embodiment thereof. Further, wherever possible, the following description refers to the reference numerals included in the following Figures, in which features depicted in multiple Figures are designated with consistent reference numerals. The present embodiments are not limited to the precise arrangements and instrumentalities shown in the Figures.

FIG. 4 is a perspective view of a wireless charging vehicle lift system being utilized with the vehicle lift system of FIG. 1;

Figure 1:
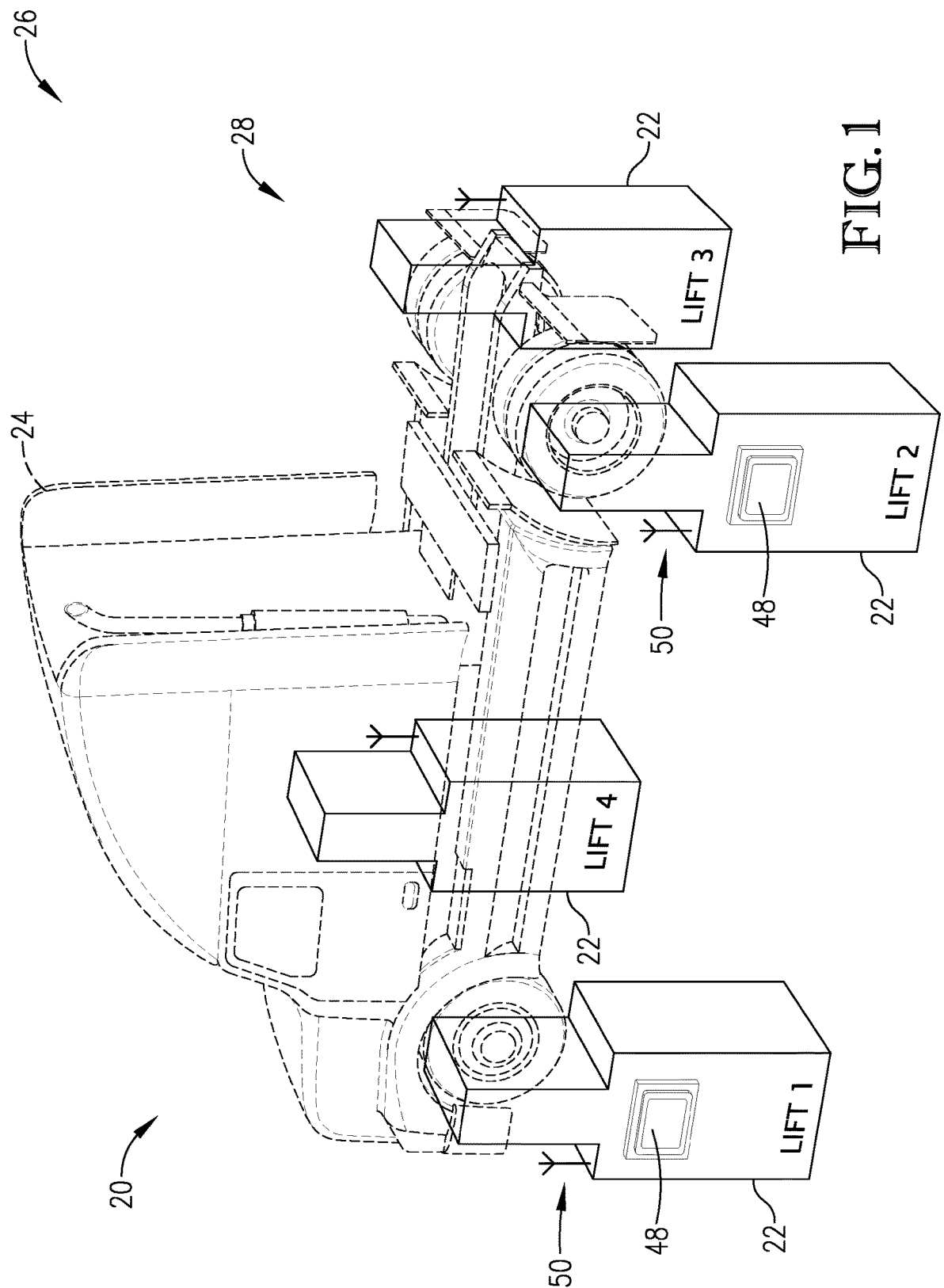
FIG. 1 is a perspective view of a vehicle lift system showing an exemplary environment of lifting a tractor unit of a semi-trailer.

The Figures depict exemplary embodiments for purposes of illustration only. One skilled in the art will readily recognize from the following discussion that alternative embodiments of the systems and methods illustrated herein may be employed without departing from the principles of the invention described herein.

DETAILED DESCRIPTION OF EMBODIMENTS

Detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. For instance, the drawing figures do not limit the present invention to the specific embodiments disclosed and described herein. Furthermore, directional references (for example, top, bottom, up, and down) are used herein solely for the sake of convenience and should be understood only in relation to each other. For instance, a component might in practice be oriented such that faces referred to as "top" and "bottom" are sideways, angled or inverted relative to the chosen frame of reference.

An example of MCLs incorporated in a wireless portable vehicle lift system 20 is illustrated in FIG. 1, which illustrates a vehicle lift system 20 with four individual lifts 22 for lifting a vehicle 24. Although FIG. 1 depicts a four-lift system, any combination of one or more lifts 22 may be used. It should also be understood that lift system 20 is not limited for use with vehicles, but also may be used to raise or lower other objects relative to a floor or ground surface, such as aircraft, industrial machinery, shipping containers, construction subassemblies, and the like. In general, however, the lifts 22 may be used within a facility 26 (e.g., a repair shop) to lift vehicles. Specifically, the lifts 22 may be operationally used within a working area 28 of the facility when being used to lift vehicles.

Figure 2:
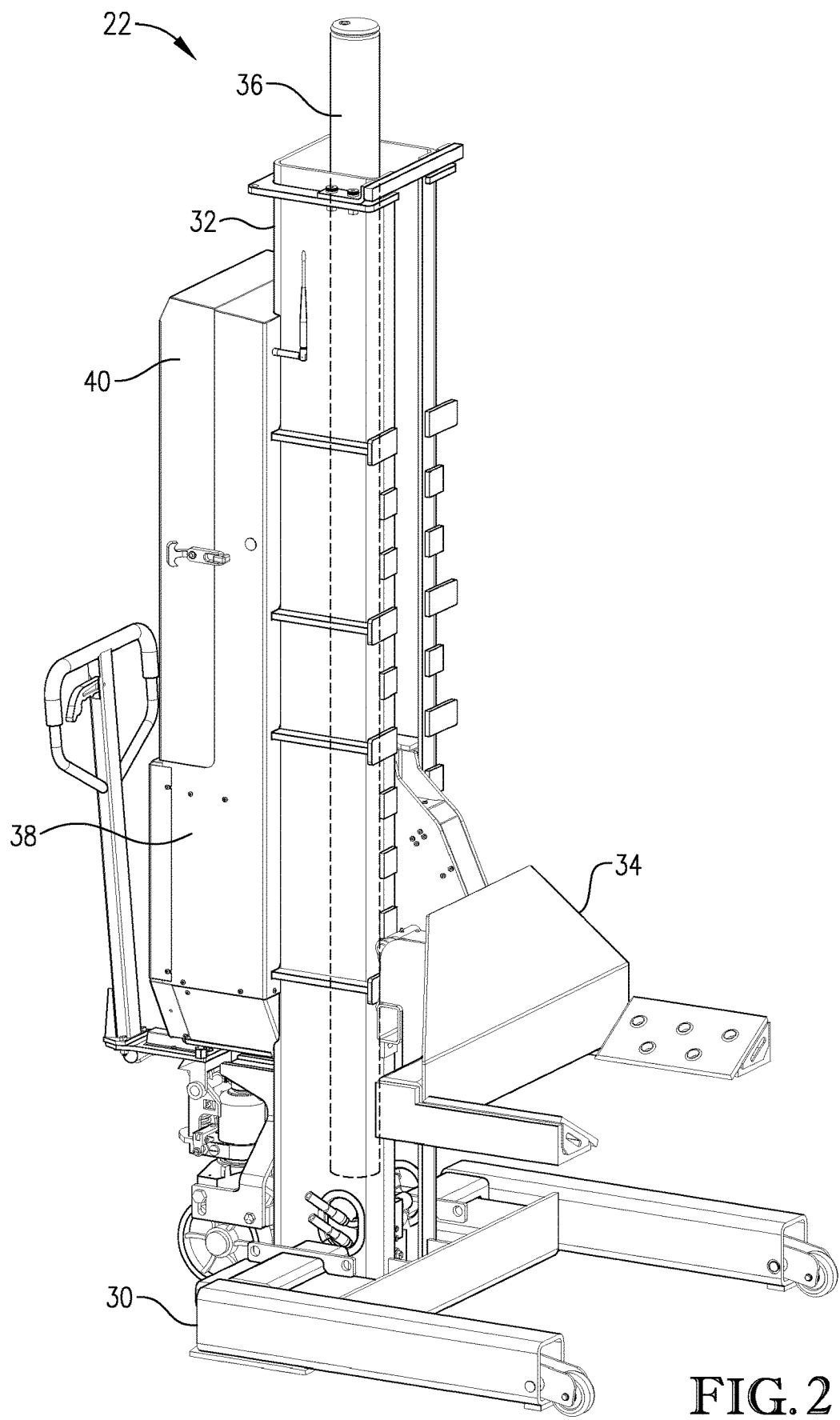
FIG. 2 is a perspective view of an embodiment of a mobile vehicle lift.
Figure 3A:
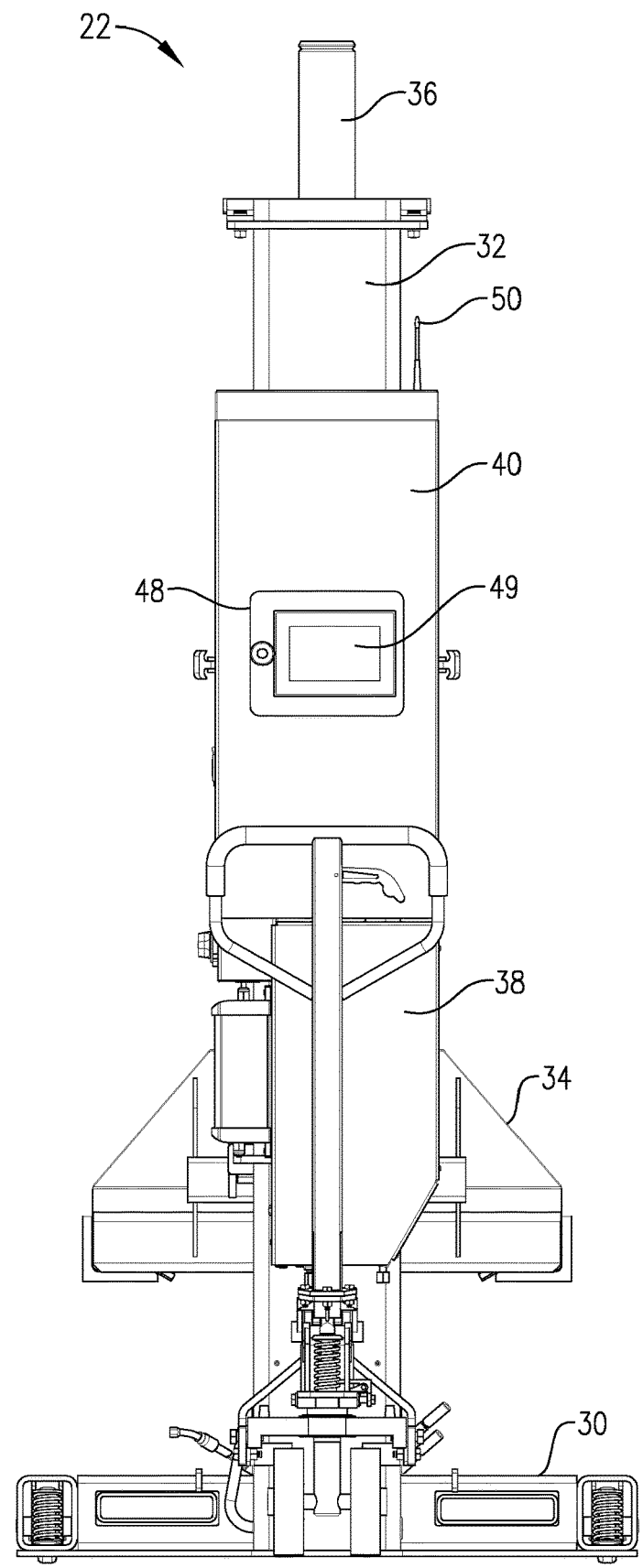
FIG. 3A is a rear view of the embodiment of the mobile vehicle lift shown in FIG. 2.
Figure 3B:
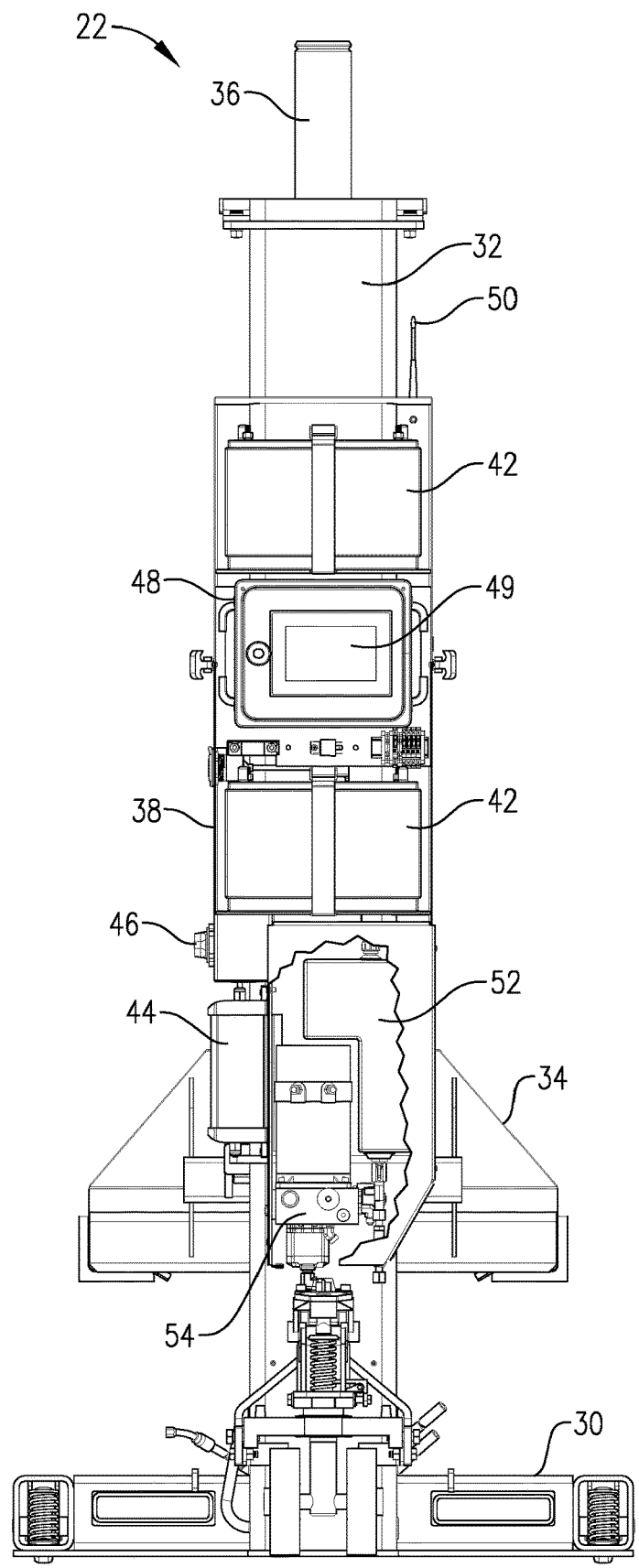
FIG. 3B is a rear view of embodiment of the mobile vehicle lift shown in FIG. 3A, with a rear panel removed to show internal components.

An example of a vehicle lift 22 included in such a vehicle lift system 20 is illustrated in more detail in FIGS. 2, 3A, and 3B. Embodiments of the invention, such as those illustrated in FIGS. 2, 3A, and 3B may be utilized with vehicle lifts such as those described in commonly owned U.S. Pat. No. 9,352,944, which is incorporated herein by reference in its entirety. With reference to FIG. 2, the vehicle lifts 22 broadly includes a base 30, a post 32, a carriage assembly 34, a lift actuator 36, and a main housing 38. The base 30 supports the lift 22 on the floor or the ground. The post 32 is rigidly coupled to the base 30 and extends upwardly therefrom. The carriage assembly 34 is configured to engage a wheel of a vehicle and is vertically shiftable relative to the post 32. The lift actuator 36 is received in the post 32 and is operable to vertically raise and lower the carriage assembly 34 relative to the post 32 and the base 30. The main housing 38 is attached to the post 32 and encloses many of the components of that make up the control and power systems of the lift 22. The main housing 38 may also include a removable access panel 40 for providing access to various components of the lift's 22 control and power systems.

FIGS. 3A and 3B provide a view of the back of the lift 22. FIG. 3B shows the access panel 40 being removed and a lower portion of the main housing 38 cut away to show certain internal components located in the upper portion of the main housing 38. The lift 22 may generally include an electrical power supply, an electronic control system, and a hydraulic power system. More specifically, FIG. 3B shows that the electrical power supply system of the lift 22 can include two rechargeable batteries 42 (e.g., 12 VDC lead-acid batteries), a battery charger 44, and a main power switch 46. The electronic control system of the lift 22 can include a modular control unit 48 (e.g., with a touchscreen display 49) and a communications antenna 50. The hydraulic power system of the lift 22 can include a hydraulic reservoir 52, a hydraulic pump 54, a hydraulic cylinder (not shown), and a plurality of hydraulic valves (not shown). The electronic control system can be used to control the hydraulic power system so as to control the raising and lowering operations of the lift 22.

The electrical power supply system (including the batteries 42) is configured to provide power to the individual systems of the lift 22, including the electronic control system and the hydraulic power system. As such, the electrical power supply system provides the electrical power necessary to control and operate the lifts 22. Generally, the batteries 42 of the electrical power supply system require frequent charging, so as to maintain sufficient charge to provide continued functionality of the lift 22 throughout a working day. However, it can be difficult to keep the lift 22 physically coupled with a standard recharging power source, such as a mains power outlet, because the lift 22 is mobile and may be used in locations out of range of such standard recharging power sources. Furthermore, in some instances, the electrical power cords generally used to electrically connect recharging power sources with the lift 22 may interfere with the operation and/or mobility of the lift 22, or may otherwise interfere with the maintenance being performed on the vehicle being raised by the lift 22. Thus, as described in more detail below, embodiments of the invention are configured to provide a wireless recharging system for the lift 22.

As illustrated in FIG. 4, embodiments of the present invention comprise a wireless charging vehicle lift system 20 configured to provide wireless power to each of the individual lifts 22 included in the lift system 20. In more detail, the lift system 20 includes one or more lifts 22, one or more power receivers in the form of photovoltaic receivers 56 associated with each lift 22 (or a single photovoltaic receiver 56 associated more generally with the lift system 20) and in electrical communication with the batteries 42 of the lifts 22, a control system (not shown in FIG. 4), and one or more power transmitters in the form of light transmitters 58 spaced apart from the lifts 22 and configured to transmit electrical energy to the photovoltaic receivers 56. Through the use of the photovoltaic receivers and light transmitters 56, 58, embodiments of the present invention are configured to overcome the previously described issues related to charging batteries 42 of lift 22 via physical connection (e.g., an electrical power cord). Specifically, because the photovoltaic receivers and light transmitters 56, 58 are configured to receive and transmit electrical energy wirelessly, the batteries 42 of the lifts 22 can be charged wirelessly (i.e., without the need for a physical connection).

In more detail, embodiments of the present invention provide for the light transmitters 58 to comprise various types of devices capable of generating and/or transmitting light (e.g., electromagnetic waves in the visible, ultraviolet, or infrared spectrum). The use of light allows for energy to be transferred wirelessly to the lift 22. The light transmitter 58 may be configured to transmit light a distance of at least 5 feet, at least 10 feet, at least 15 feet, at least 20 feet, at least 25 feet, at least 50 feet, at least 100 feet, at least 150 feet, at least 200 feet, or at least 300 feet.

For instance, in some embodiments, the light transmitters 58 may comprise coherent light sources, such as laser transmitters. The laser transmitter may have a power output of at least 10 Watts, at least 20 Watts, at least 30 Watts, at least 40 Watts, or at least 50 Watts. In some embodiments, the laser transmitters will comprise high-powered lasers, such as CO2 lasers. In such embodiments, only one high-powered laser (e.g., a 50-Watt laser) may be used. In other embodiments, the lasers may comprise a plurality of low- or mid-powered lasers (e.g., less than 50-Watt lasers), such as laser diodes. In these embodiments, the laser transmitters each have a power output of no more than 30 Watts, no more than 20 Watts, no more than 10 Watts, no more than 5 Watts, or no more than 1 Watt.

In alternative embodiments, the light transmitters 58 may comprise incoherent light sources, such as bulbs or lenses (e.g. phosphorous lenses), light-emitting diodes (LEDs), or the like. The light transmitter 58 may also be associated with lenses and mirrors to focus the light transmitted by the LEDs. Nevertheless, in some embodiments, the light transmitters 58 may be part of a light-transmitter station 68 (See, e.g., FIGS. 5 and 6), which can include one or multiple individual light transmitters 58. In certain embodiments, the light-transmitter station 68 may include one individual light transmitter 58 for each vehicle lift 22 and/or photovoltaic receiver 56 included in the lift system 20.

Figure 6:
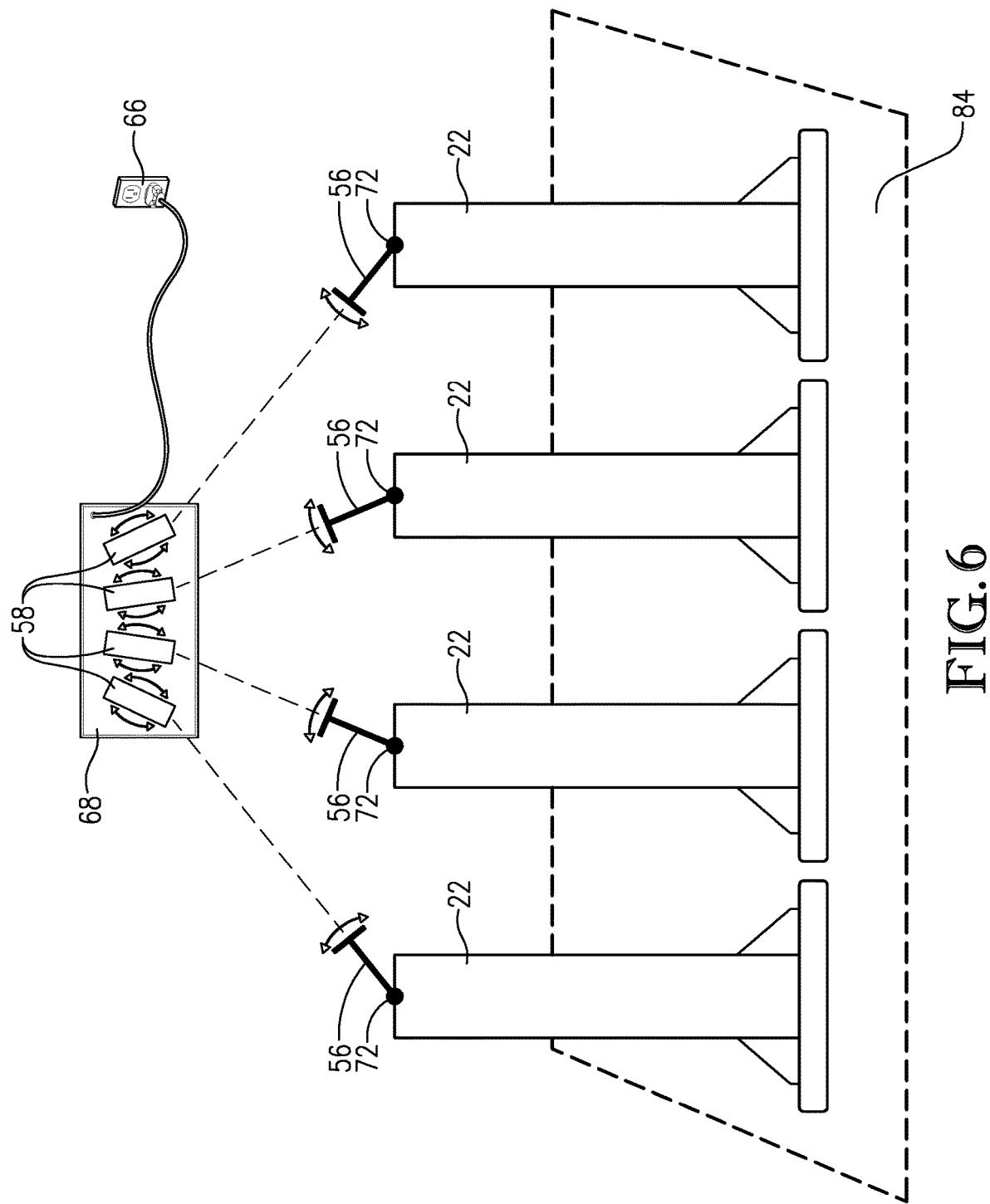
FIG. 6 is a schematic view showing adjustable light transmitters and photovoltaic receivers.

In some embodiments, the wireless charging vehicle lift system 20 will include the control system for controlling the functionality of the light transmitters 58. For instance, the control system may control activation/deactivation of the light transmitters 58. The control system may also control the direction in which the light transmitters 58 are being aimed. Such control may be via electric motors or other electromechanical control systems, as best illustrated in FIG. 6. In some embodiments, the control system may also be configured to focus the light emitted by the light transmitters 58 so as to control the shape and size of the beam of the emitted light.

As illustrated in FIG. 4, in some embodiments, the light transmitters 58 will be positioned on a ceiling 62 of a facility 26 in which the vehicle lifts 22 are being used. As such, the light transmitters 58 may be positioned generally above the photovoltaic receivers 56, such that the light transmitters 58 are required to direct light in a downward direction towards the vehicle lifts 22, and particularly towards the photovoltaic receivers 56 associated with the vehicle lifts 22. As will be described in more detail below, the lifts 22 may generally be positioned on a floor 64 of the facility 26 when being charged. As such, the light transmitters 58 can be configured to direct light downwards from the ceiling 62 onto the lifts 22 and/or the photovoltaic receivers 58 positioned on the floor 64. In other embodiments, the light transmitters 56 may be positioned elsewhere in the facility 26. For instance, the light transmitters 58 may be positioned on a wall 60 of the facility 26 (See, e.g., FIGS. 5 and 6). Furthermore, in some embodiments, the light transmitters 58 may be mobile to facilitate movement of the light transmitters 58 through the facility 26.

As best illustrated in FIG. 6, the light transmitters 58 may be connected to a power source 66, such as mains power, and may be configured to convert the power from the power source 66 into light, which is directed towards the photovoltaic receivers 56. In alternative embodiments, "green" sources of power may be used by the light transmitters 58, such as solar panels arranged on a roof of the facility 26.

The photovoltaic receivers 56 may generally comprise any type of receiver capable of receiving light and converting the light into electrical energy (e.g., electricity). In general, the photovoltaic receivers 56 may be incorporated with a top portion of the lifts 22 so as to provide a clear transmission path between the photovoltaic receivers 56 and the light transmitters 58. In other embodiments, the photovoltaic receivers 56 may be positioned spaced apart from the lifts 22. Further, in some embodiments, the photovoltaic receivers 56 may be moveable to facilitate positioning of the photovoltaic receivers 56 about the facility 26.

In certain specific embodiments, the photovoltaic receiver 56 may comprise a solar panel with one or more solar cells. In some embodiments, the photovoltaic receiver 56 may be rectangular or dish-shaped and may include a plurality of photo detectors positioned adjacent a perimeter of the photovoltaic receivers 56. Such photo detectors may be used to assist with aligning the light transmitters 58 and the photovoltaic receivers 56. The solar panels of various embodiments may be configured to receive at least 10%, at least 20%, at least 30%, at least 40%, at least 50%, at least 60%, at least 70%, at least 80%, at least 90%, at least 95%, or at least 99% of the light emitted by the light transmitter 58.

In other embodiments, the photo detectors may be used to determine whether a transmission path between the transmitters 58 and the photovoltaic receivers 56 is obstructed or blocked, such that transmission by the light transmitter 58 can be halted. Such a feature may be implemented for safety reasons to ensure injury does not result from an individual being positioned within the transmission path. In embodiments, the control system may detect a blocked condition based upon the amount of light being transmitted and received. If less light is being received than transmitted, than either the path is being obstructed by some foreign body, or the light transmitter 58 and/or photovoltaic receiver has moved out of alignment. The control system may eliminate the latter possibilities by monitoring the location and orientation of the respective components, analyzing the speed and severity of the drop in light level received, or performing other functions indicative of the blocked condition.

As best illustrated in FIG. 6, and as with the light transmitter 58, a control system 70 may control positioning of the photovoltaic receivers 56. Such control may be via electric motors 72 or other electromechanical control systems (not directly illustrated). In some embodiments, the control system may receive input from the photo detectors on the photovoltaic receivers 56 for purposes of making positional adjustments of the photovoltaic receivers 56. The positional adjustments may include changes in orientation and position. The control system may also control the charging of specific batteries 42 of the lift system 20. For instance, in embodiments in which each of the lifts 22 include its own photovoltaic receiver 56, the control system may determine which battery 42 of the lift system 20 has the lowest electrical charge. The control system may then instruct the light transmitter 58 to direct light at the photovoltaic receiver 56 associated with the lift 22 of the low-charged battery 42. Upon successfully charging of the low-charged battery 42, the control system may sequentially instruct the light transmitter 58 to transmit light to the photovoltaic receivers 56 associated with lifts 22 having the next-lowest charged batteries 42.

To facilitate efficient charging, the control system 70 may condition the electricity generated by the photovoltaic receiver 56 for proper charging of the batteries 42. Such conditioning may be amplitude/voltage/waveform adjustments, modifications, scaling, etc.

In one or more embodiments, the control system 70 may be associated with one or both of the light transmitters 58 and/or the photovoltaic receivers 56. The association may be direct, via a physical connection, or indirect, via a wireless connection. Nevertheless, the control system 70 may provide for communication between the light transmitters 58 and/or the photovoltaic receivers 56 (e.g., wireless communication via Bluetooth or WiFi).

Figure 7:
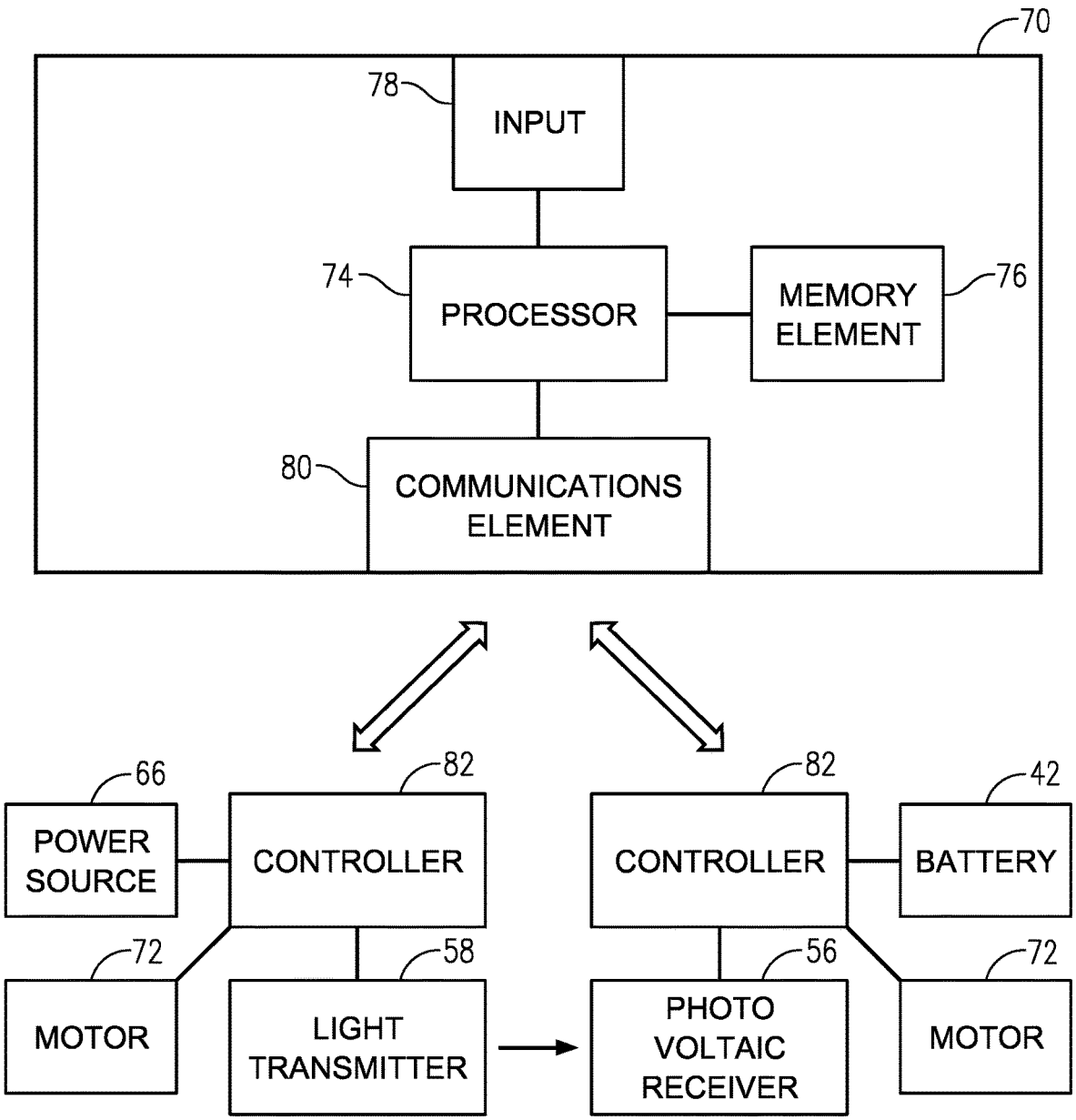
FIG. 7 is a hardware diagram showing various hardware components of a control system.

As illustrated in FIG. 7, the control system 70 may comprise a processor 74, a memory element 76, an input 78, and a communications element 80. The functionality of the control system 70 may be carried via one or more electronic processors 74 (e.g., processors, microprocessors, microcontrollers, etc.) and associated memory elements 76. The memory element 76 includes a non-transitory computer readable storage medium. The memory element 76 may store one or more computer programs for execution by the processor 74. The input 78 (such as touchscreen display 49 shown in FIG. 3A) receives requests from the user. The communications element 80 communicates with a controller 82 in the light transmitter 58 and/or the photovoltaic receiver 56. It should also be appreciated that the control system 70 may be collocated with and perform the functions of the controller 82 of the light transmitter 58 or the photovoltaic receiver 56. It should also be appreciated that the controller 82 may include a microprocessor, a memory, and other electronic components. The controller 82 may interface with the motor 72 to instruct pivotal, rotational, and/or translational movement of the respective components such that alignment between the light transmitter 58 and the photovoltaic receiver 56 may be achieved and maintained.

As such, the control system 70 can perform various functions, such as sensing the charge of each of the batteries 42, determining whether such power being provided to such batteries 42 needs to be conditioned (e.g., increased and/or scaled) for storage in the lifts' 22 batteries 42, sensing the power being received by the photovoltaic receivers 56, sensing the power being transmitted by the light transmitters 58, and/or determining an alignment between the light transmitters 58 and the photovoltaic receivers 56.

Figure 5:
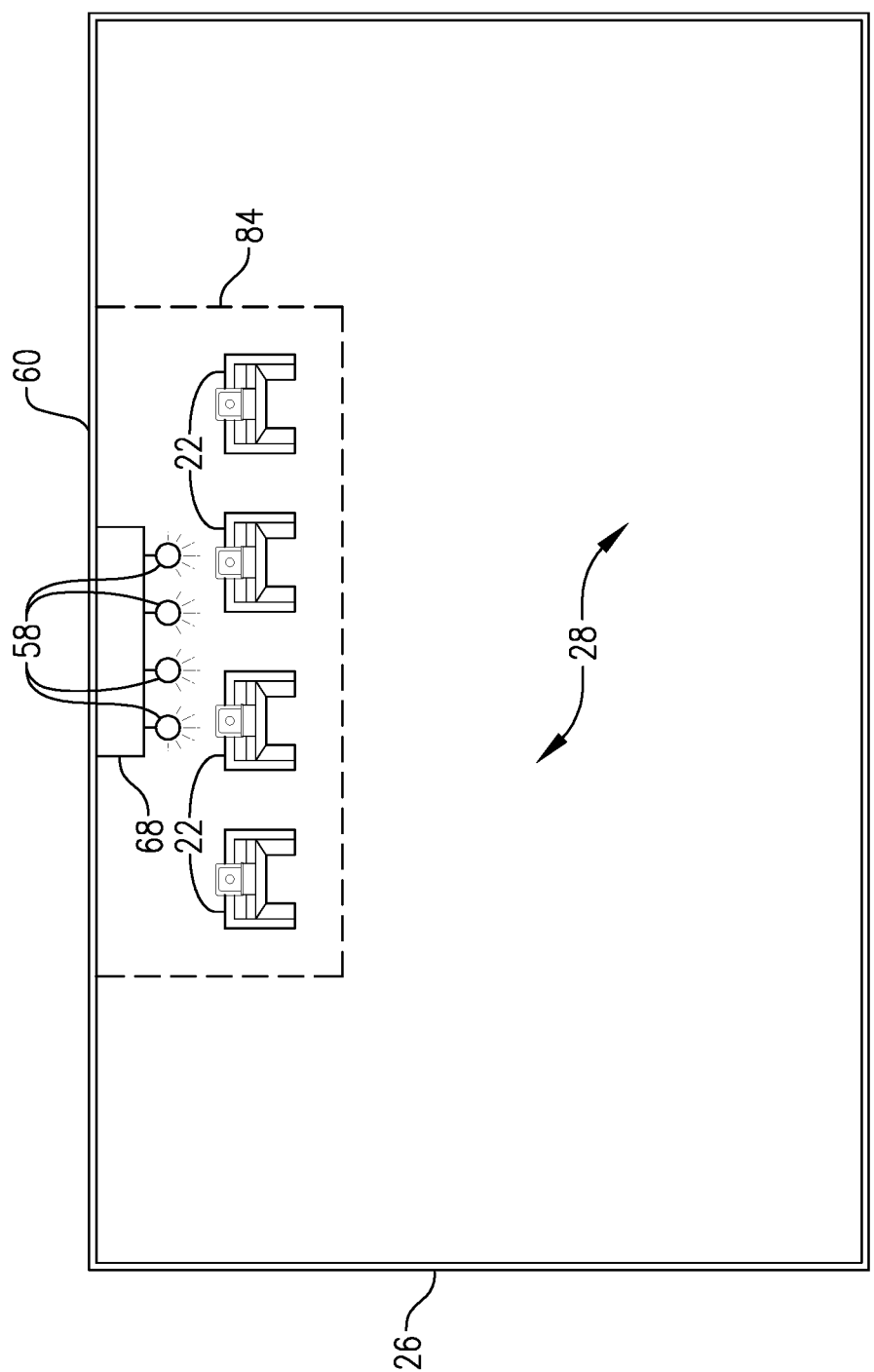
FIG. 5 is a top view showing a charging area and a working area for the wireless charging vehicle lift system.

Given the above, the wireless charging lift system 20 is configured to wirelessly charge the batteries 42 of the lifts 22 of a lift system (e.g., lift system 20 of FIG. 1) by transmitting light from the light transmitters 58 to the photovoltaic receivers 56. To begin, the lifts 22 should each be positioned within a charging area 84 of the facility 26, as best shown in FIG. 5. In some embodiments, the charging area 84 for each lift 22 may be a rectangular or circular area, within which the lift 22 should be positioned. In certain embodiments, the charging area 84 will be an area within the facility 26 or shop that is separate or distinct from working area of the shop. As such, the charging area 84 may be storage area where lifts 22 are stored when not being used to lift vehicles. Alternatively, the charging area 84 may be the working area 28. In some embodiments, the charging area 84 will have a surface area of about 9 square feet, about 16 square feet, or about 25 square feet.

With the lifts 22 positioned within the charging area 84, the light transmitters 58 will be aimed in the general direction of the lifts 22 and/or of the photovoltaic receivers 56 associated with the lifts 22. The control system may further refine the alignment between the light transmitters 58 and the photovoltaic receivers 56 by adjusting the position of either (or both) of the light transmitters 58 and the photovoltaic receivers 56. As noted above, in some embodiments, the control system will use the photo detectors on the photovoltaic receivers 56 to adjust the alignment between the light transmitters 58 and the photovoltaic receivers 56. The control system may also adjust/focus the light transmitted by the light transmitter for efficient reception and conversion into electrical energy by the photovoltaic receivers 56.

If the lift system 20 includes a single lift 22, the light transmitter 58 can transmit light to the photovoltaic receiver 56 associated with the single lift 22 so as to charge the battery 42 of the single lift 22. If the lift system 20 includes multiple lifts 22, the light transmitter 58 can transmit light to the single photovoltaic receiver 56 associated with the lifts 22, and the control system can distribute energy to each of the batteries 42 of the lifts 22 for purposes of charging. In other embodiments, each of the lifts 22 may have its own photovoltaic receiver 56, such that the single light transmitter 58 can be caused to sequentially or simultaneously transmit light to each of the photovoltaic receivers 56 of the lifts 22 for purposes of charging the batteries 42 associated with the lifts 22.

In still further embodiments, as best illustrated in FIG. 6, the light transmitter 58 may include a light-transmitter station 68 comprising multiple transmitting devices. Each light transmitter 54 may be individually movable such that each is directed to a corresponding photovoltaic receiver 56 In these embodiments light can be transmitted simultaneously to multiple photovoltaic receivers 56 for purposes of charging the batteries 42 associated with the lifts 22.

In certain embodiments that include the light-transmitter station 68, the individual light transmitters 58 may be configured to locate (e.g., via the control system) the individual lifts 22 in the charging area 84, and the light transmitters 58 can automatically align themselves (e.g., via the control system) with each individual lift 22 (and/or photovoltaic receiver 56 associated with each lift 22). Alternatively, the photovoltaic receiver 56 on each lift 22 can automatically align itself (e.g., via the control system) with one of the light transmitters 58 when the lifts 22 are in the charging area 84, as best shown in FIG. 5.

As was noted above, each light transmitter 58 (or the light-transmitter station more generally) can communicate with each lift 22 and/or with the photovoltaic receiver on each lift 22. Such communication can include the transmission of wireless communication signals that include information pertaining to the battery 42 charge level of each lift 22 (as was noted above). In some embodiments, when batteries 42 are at substantially uneven charge levels the light transmitters 58 can either (1) change intensity of transmitted light to charge the lowest-charged battery 42 with the highest intensity, or (2) multiple light transmitters 58 can align themselves appropriately to charge the battery 42 of lowest level to accelerate its charging.

Beneficially, the use of light transmitters 58 in the form of lasers provide for transmission of electrical energy (and charging of batteries 42) to be performed in a quick and efficient manner (i.e., much faster than trickle charging) and over long distances. In addition to lasers, some embodiments may use incoherent light transmitters 58, such as phosphorous lenses. Furthermore, in addition or in the alternative to photovoltaic receivers 56 in the form of solar panels, some embodiments may use other types of devices for converting light into energy. In some embodiments, a Peltier effect chip may be used to generate energy. In other embodiments, a Stirling cycle/steam engine may be used to generate energy.

In embodiments of the invention, the light transmitter comprises a phosphorous lens excited by a laser. In some of these embodiments, the phosphorous lens comprises yellow phosphorous. Accordingly, the laser may include a blue laser, or white light. The light transmitter may also be associated with a reflector (such as a parabolic reflector) and a diffusor for focusing the transmitted white light. The phosphorous lens may be positioned near the laser or spaced apart from the laser. If spaced apart, the phosphorus lens may be positioned adjacent to and/or on the vehicle lift. For example, the phosphorus lens may be positioned adjacent to the photovoltaic receiver.

It is to be understood that while certain forms of the present invention have been illustrated and described herein, it is not to be limited to the specific forms or arrangement of parts described and shown.

Additional Considerations

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current technology can include a variety of combinations and/or integrations of the embodiments described herein.

Although the present application sets forth a detailed description of numerous different embodiments, it should be understood that the legal scope of the description is defined by the words of the claim(s) set forth at the end of this patent and equivalents. The detailed description is to be construed as exemplary only and does not describe every possible embodiment since describing every possible embodiment would be impractical. Numerous alternative embodiments may be implemented, using either current technology or technology developed after the filing date of this patent, which would still fall within the scope of the claims.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of routines, subroutines, applications, or instructions. These may constitute either software (e.g., code embodied on a machine-readable medium or in a transmission signal) or hardware. In hardware, the routines, etc., are tangible units capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as computer hardware that operates to perform certain operations as described herein.

The various operations of example methods described herein may be performed, at least partially, by one or more processing elements that are temporarily configured (e.g., by software) or permanently configured to perform the relevant operations. Whether temporarily or permanently configured, such processing elements may constitute processing element-implemented modules that operate to perform one or more operations or functions. The modules referred to herein may, in some example embodiments, comprise processing element-implemented modules.

Similarly, the methods or routines described herein may be at least partially processing element-implemented. For example, at least some of the operations of a method may be performed by one or more processing elements or processing element-implemented hardware modules. The performance of certain of the operations may be distributed among the one or more processing elements, not only residing within a single machine, but deployed across a number of machines. In some example embodiments, the processing elements may be located in a single location (e.g., within a home environment, an office environment or as a server farm), while in other embodiments the processing elements may be distributed across a number of locations.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

The invention claimed is:

1. A vehicle lift system configured for wireless charging a plurality of vehicle lifts in a work area, the vehicle lift system comprising:
the plurality of vehicle lifts, with each vehicle lift including—
a base;
a carriage configured for receiving a wheel of a vehicle;
a lift actuator configured to vertically raise and lower the carriage relative to the base;

a battery configured to provide electrical energy to the vehicle lift;
a photovoltaic receiver electrically coupled with the battery; and
at least one light transmitter configured to wirelessly transmit electrical energy to said photovoltaic receivers of said vehicle lifts,
wherein the work area includes a charging area within which said vehicle lifts are configured to be positioned to receive the electrical energy from said light transmitter,
wherein said light transmitter is configured to wirelessly transmit electrical energy to each of said vehicle lifts sequentially based on charge levels of said batteries of said vehicle lifts.

2. The vehicle lift system of claim 1, wherein said light transmitter is configured to transmit light in an ultraviolet wavelength.

3. The vehicle lift system of claim 1, wherein said light transmitter is configured to transmit coherent light.

4. The vehicle lift system of claim 3,
wherein said light transmitter comprises a single, high-power laser transmitter,
wherein said laser transmitter has an output of at least 30 W.

5. The vehicle lift system of claim 1,
wherein said light transmitter is configured to transmit incoherent light,
wherein said light transmitter comprises a phosphorous lens.

6. The vehicle lift system of claim 1,
wherein said light transmitter is configured to be incorporated at an elevated position within a facility in which said vehicle lifts are being used,
wherein said light transmitter is configured to direct light downward to said photovoltaic receivers of said vehicle lifts.

7. The vehicle lift system of claim 1,
wherein said light transmitter is associated with a control system for aiming transmitted light towards said photovoltaic receivers of said vehicle lifts,
wherein said control system includes a motor for adjusting a direction at which said light transmitter is being aimed.

8. The vehicle lift system of claim 7,
wherein said control system includes a lens and a reflector for focusing said transmitted light,
wherein said lens and said reflector are configured to focus the transmitted light to have a specific shape and size which corresponds with said photovoltaic receivers of said vehicle lifts.

9. The vehicle lift system of claim 7,
wherein said photovoltaic receivers of said vehicle lifts include one or more photo detectors positioned adjacent to an edge of said photovoltaic receivers of said vehicle lifts,
wherein said photovoltaic receivers of said vehicle lifts are in communication with said control system,
wherein said photo detectors provide feedback to said control system of said light transmitter to aid in aiming the transmitted light towards said photovoltaic receivers of said vehicle lifts.

10. The vehicle lift system of claim 1, further comprising:
a control system for controlling at least one of said photovoltaic receivers of said vehicle lifts and said light transmitter based on the charge levels of said batteries of said vehicle lifts.

11. A wireless charging vehicle lift system configured to be utilized within a work area for a first mobile vehicle lift having a first battery and a second mobile vehicle lift having a second battery, said wireless charging vehicle lift system comprising:
at least one light transmitter for transmitting light;
a first photovoltaic receiver for receiving at least a portion of the light transmitted by said at least one light transmitter, wherein said first photovoltaic receiver is electrically coupled with said first battery of the first mobile vehicle lift;
a second photovoltaic receiver for receiving at least a portion of the light transmitted by said at least one light transmitter, wherein said second photovoltaic receiver is electrically coupled with said second battery of the second mobile lift; and
a control system configured to control at least one of said light transmitter, said first photovoltaic receiver, and said second photovoltaic receiver,
wherein the work area includes a charging area within which said first and second mobile vehicle lifts are configured to be positioned to receive the light transmitted by said light transmitter,
wherein said control system is configured to control said light transmitter, said first photovoltaic receiver, and/or said second photovoltaic receiver such that light is transmitted to each of said first and second mobile vehicle lifts sequentially based on charge levels of said first and second batteries of said first and second mobile vehicle lifts.

12. The wireless charging vehicle lift system of claim 11, wherein said control system is configured to shift an orientation of said at least one light transmitter into alignment with said first photovoltaic receiver.

13. The wireless charging vehicle lift system of claim 11, wherein said control system is configured to disable said at least one light transmitter whenever a blocked condition is detected that is indicative that a transmission path between said first photovoltaic receiver and said light transmitter is obstructed.

14. The wireless charging vehicle lift system of claim 11,
wherein said control system is configured to determine a voltage level of said first battery and a voltage level of said second battery,
wherein said control system is configured to prioritize charging between said first battery and said second battery based on the respective voltage levels.

15. The wireless charging vehicle lift system of claim 11, wherein said at least one light transmitter includes:
a first laser source;
a second laser source,
wherein said control system is configured to orient said first laser source towards said first photovoltaic receiver,
wherein said control system is configured to orient said second laser source towards said second photovoltaic receiver.

16. A method for wirelessly providing power to a plurality of portable vehicle lifts in a work area, wherein said method includes the following steps:
positioning the vehicle lifts within a charging area of the work area;
transmitting light energy from a light transmitter to photovoltaic receivers positioned on each of the vehicle lifts;
converting, via the photovoltaic receivers, the light energy from the light transmitter to electrical energy; and charging batteries associated with the vehicle lifts with the electrical energy,
wherein said light transmitter is configured to transmit the light energy to each of said vehicle lifts sequentially based on charge levels of said batteries of said vehicle lifts.

17. The method of claim 16,
wherein the light transmitter comprises a laser,
wherein the photovoltaic receivers comprise solar panels.

18. The method of claim 16, further comprising:
detecting a blocked condition indicative of a transmission path between the photovoltaic receivers and the light transmitter being obstructed; and
disabling transmission of light energy by the light transmitter upon detection of the blocked condition.

19. The method of claim 16, further comprising:
adjusting a position of the light transmitter to maximize reception of the light energy received by the photovoltaic receivers.

* * * * *